(12) United States Patent
Zhu

(10) Patent No.: US 9,555,476 B2
(45) Date of Patent: Jan. 31, 2017

(54) CUTTING TOOL

(71) Applicant: KYOCERA Corporation, Kyoto-shi, Kyoto (JP)

(72) Inventor: Yaocan Zhu, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 14/768,745

(22) PCT Filed: Feb. 20, 2014

(86) PCT No.: PCT/JP2014/053994
§ 371 (c)(1),
(2) Date: Aug. 18, 2015

(87) PCT Pub. No.: WO2014/129530
PCT Pub. Date: Aug. 28, 2014

(65) Prior Publication Data
US 2016/0001374 A1    Jan. 7, 2016

(30) Foreign Application Priority Data

Feb. 22, 2013  (JP) .................................. 2013-033527
May 23, 2013   (JP) .................................. 2013-109112

(51) Int. Cl.
*B23B 27/14*   (2006.01)
*C23C 30/00*   (2006.01)
*C23C 14/06*   (2006.01)
*C23C 14/34*   (2006.01)
*C23C 14/50*   (2006.01)

(52) U.S. Cl.
CPC ........... *B23B 27/14* (2013.01); *C23C 14/0664* (2013.01); *C23C 14/3464* (2013.01); *C23C 14/505* (2013.01); *C23C 30/005* (2013.01); *B23B 2228/10* (2013.01); *B23B 2228/105* (2013.01)

(58) Field of Classification Search
USPC ... 51/307, 309; 428/212, 216, 697, 698, 699
See application file for complete search history.

(56) References Cited

FOREIGN PATENT DOCUMENTS

| JP | 2008-105164 A |   | 5/2008 |
|----|---------------|---|--------|
| JP | 2008-296290   | * | 12/2008 |
| JP | 2009-066673   | * | 4/2009 |

OTHER PUBLICATIONS

International Search Report (Form PCT/ISA/210) mailed on May 20, 2014 and issued for International Patent Application No. PCT/JP2014/053994.

\* cited by examiner

*Primary Examiner* — Archene Turner
(74) *Attorney, Agent, or Firm* — Volpe and Koenig, P.C.

(57) ABSTRACT

Problem: To provide a cutting tool that exhibits superior chipping resistance and wear resistance.
Resolution means: A cutting tool 1 is provided with a base 2, and a coating layer 6 comprising columnar crystals 7 that cover the surface of the base 2. A Cutting edge 5 is formed at the crossing ridge line of a rake face 3 and a flank face 4. The average inclination angle ($\theta 2$) of the flank face 4, in the longitudinal direction of the columnar crystals 7 with respect to the direction orthogonal to the surface of the base 2, is greater than the average inclination angle ($\theta 1$) of the rake face 3, in the longitudinal direction of the columnar crystals 7 with respect to the direction orthogonal to the surface of the base 2.

9 Claims, 4 Drawing Sheets

CUTTING TOOL

TECHNICAL FIELD

The present invention pertains to a cutting tool having a coating layer formed on a surface of a base.

BACKGROUND

A cutting tool has a surface of a base that is covered by a coating layer made of a sintered alloy such as a cemented carbide, and a cermet, a high-hardness sintered body such as a diamond or cBN (cubic boron nitride), and a ceramics such as aluminum oxide, silicon nitride, and the like, used as a means of improving the wear resistance and fracture resistance.

In addition, research into coating layers made of TiAlN and the like is actively ongoing. For example, Patent Document 1 discloses a cover film (coating layer) in which a columnar crystal on a second layer of a coating layer made of TiAlN and having two stacked layers has been grown in a direction inclined at an angle of, on average, from 1° to 15° with respect to a direction orthogonal to a surface of a base.

PRIOR ART DOCUMENT

Patent Document

Patent Document 1: Japanese Unexamined Patent Application Publication No. 2008-105164A

SUMMARY OF THE INVENTION

Problems to be Solved by the Invention

However, despite using the cover film (coating layer) in which the second layer has been grown in a direction inclined at an angle of, on average, from 1° to 15° with respect to the direction orthogonal to the surface of the base as described in Patent Document 1, the cutting ability of the cutting tool as a whole is insufficient, and further improvements have been necessary.

The present invention has been made in order to solve the above-described problem, and an object thereof is to provide a cutting tool in which the crystal status of the coating layer is optimized for a rake face and a flank face, constraining crater wear of the rake face and increasing chipping resistance on the flank face, and having generally improved cutting ability.

Means to Solve the Problem

A cutting tool of the present invention is equipped with a base and a coating layer formed from columnar crystals covering a surface of the base. A crossing ridge line of a rake face and a flank face serves as a Cutting edge. Also, an average of an inclination angle of a longitudinal direction of the columnar crystals on the flank face with respect to a direction orthogonal to the surface of the base is greater than an average of an inclination angle of a longitudinal direction of the columnar crystals on the rake face with respect to the direction orthogonal to the surface of the base.

Another cutting tool of the present invention is equipped with a base and a coating layer formed from columnar crystals covering a surface of the base. A crossing ridge line of a rake face and a flank face serves as a Cutting edge. An average orientation of a longitudinal direction of the columnar crystals on the flank face is inclined with respect to a direction orthogonal to the surface of the base. Also, an average aspect ratio of the columnar crystals on the flank face is greater than an average aspect ratio of the columnar crystals on the rake face.

EFFECT OF THE INVENTION

According to the cutting tool of the present invention, the coating layer is formed form columnar crystals. An average inclination angle of the longitudinal direction of the columnar crystals on the flank face with respect to a direction orthogonal to a surface of a base is greater than an average inclination angle of the longitudinal direction of the columnar crystals on a rake face with respect to the direction orthogonal to the surface of the base. That is, the average orientation of the longitudinal direction of the columnar crystals on the flank face is more inclined, with respect to the direction orthogonal to the surface of the base, in comparison to the rake face. As a result, on the flank face, the development of cracks in the coating layer may be constrained, the chipping resistance is improved, and boundary damage may be constrained. In addition, on the rake face, given that the inclination angle of the columnar crystals is smaller in comparison to the flank face, the hardness of the coating layer is increased and crater wear may be constrained.

According to another cutting tool of the present invention, the average orientation of the longitudinal direction of the columnar crystals on the flank face is inclined with respect to the direction orthogonal to the surface of the base, and the average aspect ratio of the columnar crystals on the flank face is greater than the average aspect ratio of the columnar crystals on the rake face. As a result, on the flank face, cracking is unlikely to occur in the coating layer, and any cracks that do occur may be constrained from progressing. As a result, the chipping resistance of the coating layer is improved on the flank face, and boundary damage, to which the flank face is prone, may be constrained. In addition, on the rake face, the coating layer is prone to high temperatures and to oxidation. However, given that the crystals making up the coating layer have many grain boundaries, oxidation may be suppressed in the coating layer, which progresses easily via the grain boundaries. As a result, the oxidation resistance of the coating layer is improved on the rake face, and crater wear, which progresses easily in the rake face, may be constrained.

That is, in any of these situations, cracks and boundary damage may be constrained on the flank face, and the progression of crater wear may be constrained on the rake face. As a result, the useful life of the cutting tool is extended.

BRIEF DESCRIPTION OF THE DRAWINGS(S)

FIG. 2A illustrates a rake face and FIG. 2B illustrates a flank face.

BEST MODE FOR CARRYING OUT THE INVENTION

Figure 1:
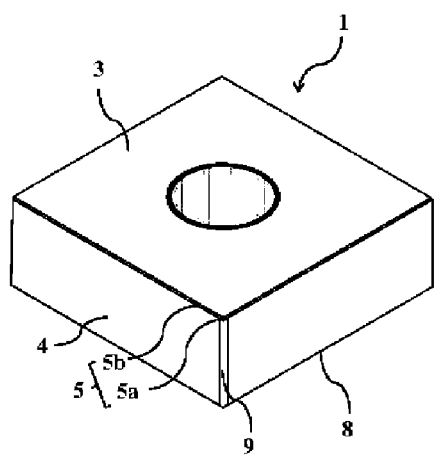
FIG. 1 is an overall perspective view of an example of a cutting tool of the present invention.
Figure 2A:
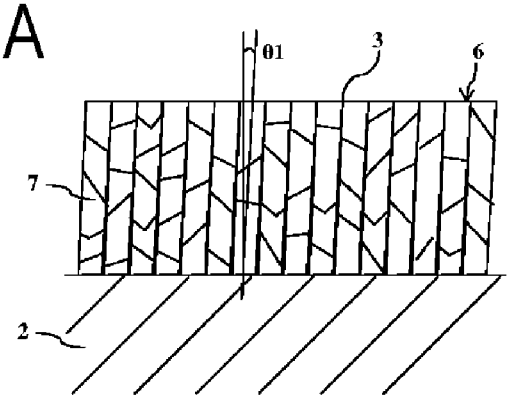
FIGS. 2A and 2B are magnifications of main parts of the cutting tool of FIG. 1, where
Figure 2B:
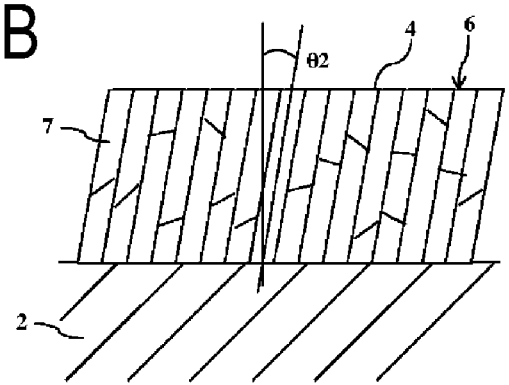

According to a preferred embodiment of a cutting tool of the present invention illustrated in FIGS. 1, 2A, and 2B, a cutting tool 1 is equipped with a base 2 and a coating layer 6 covering a surface of the base 2. The coating layer 6 is formed from columnar crystals 7, which are elongated. The columnar crystals 7 of the present invention refer to crystals having an aspect ratio of not less than 1.5 in terms of length, where the longest direction of each crystal is a longitudinal direction of the crystal, a longest length among directions orthogonal to the longitudinal direction of the crystal is a width direction of the crystal, and the aspect ratio is a ratio of the longitudinal direction of the crystal to the width direction of the crystal. The coating layer 6 is formed from the columnar crystals 7. As such, a flank face 4 and a rake face 3 have high wear resistance and fracture resistance. That is, making the coating layer 6 from granular crystals rather than the columnar crystals results in low wear resistance and fracture resistance for the flank face 4 and the rake face 3.

In addition, the cutting tool 1 has the rake face 3 as a main face, has the flank face 4 as a side face, and has a Cutting edge 5 at a crossing ridge line of the rake face 3 and the flank face 4. The cutting tool 1 of FIG. 1 is a negative type cutting insert, each main face being polygonal and substantially planar in shape and both main faces being usable. A seating surface 8 is formed on a back face of the rake face 3. The rake face 3 and the seating surface 8 are reversed upon the cutting tool 1 being flipped and reused during use. Here, the present invention is not limited to being a negative type cutting insert. For instance, a positive type cutting insert, in which only one main surface is used as the rake face 3, may also be beneficially used. Furthermore, a main surface that is round or has a non-planar shape may also be applicable. A rotating tool may also be applicable.

According to the present embodiment, the cutting tool 1 has an average inclination angle $\theta 2$ of the longitudinal direction of the columnar crystals 7 on the flank face 4 with respect to a direction orthogonal to the surface of the base 2 (hereinafter, also referred to as a film thickness direction) that is larger than an average inclination angle $\theta 1$ of the longitudinal direction of the columnar crystals 7 on the rake face 3 with respect to the film thickness direction. As a result, on the flank face 4, the development of cracks in the coating layer 6 may be constrained, the chipping resistance is improved, and boundary damage may be constrained. In addition, on the rake face 3, given that the inclination angle of the columnar crystals 7 is smaller in comparison to the flank face 4 ($\theta 1 < \theta 2$), the hardness of the coating layer 6 is increased, and crater wear may be constrained. As a result, the useful life of the cutting tool 1 is extended.

Here, the measurement of the inclination angle of the columnar crystals 7 is performed through observation with a scanning electron microscope (SEM), using an electron backscatter diffraction method (EBSD) in a field having a width of 10 μm×thickness of the coating layer. The inclination angle $\theta 1$ of the rake face 3 is measured at a position on the coating layer 6 where the surface of the base 2 has a linear shape, the coating layer 6 being observed from the flank face 4 side on a polished surface that is parallel to the flank face 4 where the cutting tool 1 has been polished from 0.1 mm to 0.2 mm. Similarly, the inclination angle $\theta 2$ of the flank face 4 is measured at a position on the coating layer 6 where the surface of the base 2 has a linear shape, the coating layer 6 being observed from the rake face 3 side on a polished surface that is parallel to the seating surface 8 where the cutting tool 1 has been polished from 0.1 mm to 0.2 mm. The specific measurement method involves specifying the outline of each crystal by checking an orientation direction of the crystal surfaces in the coating layer 6 on a color map obtained through EBSD. Then, the longest direction in the outline of each columnar crystal 7 is taken to be the longitudinal direction of the columnar crystal 7, and the inclination thereof with respect to a direction perpendicular to the film thickness direction, that is, to the surface of the base 2, is measured as the inclination angle. The average inclination angle is then calculated as the average of the inclination angle across all crystals. Here, the inclination of any granular crystal having an aspect ratio of less than 1.5 and not included among the columnar crystals 7 in the coating layer 6 is not included in the calculation of the inclination angle of the columnar crystals.

Here, in the present embodiment, the inclination angle $\theta 2$ of the columnar crystals 7 on the flank face 4 is from 10° to 50°, and the inclination angle $\theta 1$ of the columnar crystals 7 on the rake face 3 is from 0° to 20°. As a result, on the flank face 4, the effect of constraining the development of cracks in the coating layer 6 is enhanced, the chipping resistance is improved, and boundary damage is further constrained. In addition, on the rake face 3, the hardness of the coating layer 6 is enhanced and the crater wear may be more effectively constrained.

In addition, in the present embodiment, the Cutting edge 5 has a nose cutting edge 5a having a curve shape, and a straight cutting edge 5b having a linear shape. A nose portion 9 is provided on the flank face 4 directly below the nose cutting edge 5a. On the coating layer 6, an average inclination angle $\theta 3$ (not illustrated in the drawings) of the longitudinal direction of the columnar crystals 7 on the nose portion 9 is greater than the inclination angle $\theta 2$ on the flank face 4. As a result, the chipping resistance of the coating layer 6 may be increased on the nose portion 9, which is prone to minute chipping. Here, the inclination angle $\theta 3$ of the columnar crystals 7 on the nose portion 9 is measured from the rake face 3 side, using the electron backscatter diffraction method (EBSD) on the coating layer 6 of the nose portion 9 in a polished surface of the cutting tool 1 that has been polished from 0.1 mm to 0.2 mm, in a field having a width of 10 μm×the thickness of the coating layer. In such a field, the surface of the base 2 of the nose portion 9 is nearly linear. In this field, the direction in which the longest straight line in the outline of each crystal extends is taken to be the longitudinal direction of the columnar crystal, and the inclination angle is measured as the inclination of the longitudinal direction with respect to the film thickness direction. The average inclination angle is then calculated as the average of the inclination angle across all crystals. In addition, in the present invention, the inclination angle of the flank face 4 directly below the straight cutting edge 5b is taken to be the inclination angle $\theta 2$ of the flank face 4.

Furthermore, in the present embodiment, the overall composition of the coating layer 6 is made up of $(Al_{1-a-b}Ti_aM_b)C_{1-d}N_d$ (where M is one or more elements selected from among elements other than Ti in group 4, group 5, and group 6 of the periodic table, Si, and the rare earth metals, and where $0.2 \leq a \leq 0.7$, $0 \leq b \leq 0.2$, and $0 \leq d \leq 1$). Within this range, the hardness and the oxidation resistance of the coating layer are high, crater wear may be constrained on the rake face 3, and the progression of wear on the flank face may also be constrained. Here, the coating layer 6 may have an overall composition that is uniform. However, the coating layer 6 may also be configured with a multi-layer configuration of two or more layers, in which two or more types of unit layers each have a thickness on the order of from one nanometer to tens of nanometers and are layered with periodic repetition. As such, in a situation where the coating layer 6 has a multi-layer configuration of two or more layers, the composition of each layer is not limited to a situation within the range of the above-described overall composition of the coating layer 6, but may also include layers in which at least one of Ti an Al is not present.

Here, M is preferably one or more elements selected from among Cr, W, Mo, Ta, Hf, Nb, Zr, Si, and Y. However, among these, including one or more elements among Cr, Si, Nb, Mo, and W produces excellent hardness and excellent wear resistance. Furthermore, using one of Nb and Mo as M produces excellent oxidation resistance under high temperatures. As such, for example, the progression of crater wear during high-speed cutting may be constrained. Here, a TiN crystal structure in which Ti and Al are cubic crystals serves as a base, and the Al has undergone substitution. As such, the wear resistance and the fracture resistance are excellent.

In addition, the non-metal components C and N of the coating layer 6 have an effect on the hardness and toughness required for the cutting tool. In the present embodiment, d (the N content ratio) is such that $0 \leq d \leq 1$, and is specifically such that $0.8 \leq d \leq 1$. Here, according to the present invention, the above-described composition of the coating layer 6 is measurable using one of an energy dispersive spectroscopic analysis method (EPMA) and an X-ray photoelectron spectroscopic analysis method (XPS). Furthermore, in a situation where the configuration of the coating layer 6 is minute, the detailed structure may be verified through observation with a transmission electron microscope (TEM), and the detailed composition may be verified using an energy dispersive X-ray analysis method (EDS).

Furthermore, in the present embodiment, a ratio (tf/tr) of the thickness tf of the coating layer 6 on the flank face 4 to the thickness tr of the coating layer 6 on the rake face 3 is from 1.2 to 3. As a result, the wear resistance of the flank face 4 is improved, and the useful tool life may thus be extended by reducing wear of the flank face. In addition, in the present embodiment, a ratio tn/tf of the thickness tn of the coating layer 6 on the nose portion 9 to the thickness tf of the flank face 6 on the flank face 4 is from 1.2 to 2.0. As a result, the wear resistance of the nose portion 9 may also be enhanced. Here, for the present invention, the respective thicknesses tr, tf, and tn of the coating layer 6 on the rake face 3, the flank face 4, and the nose portion 9 represent average values of the thickness of the coating layer 6 at each position. These values may be calculated by measuring the thickness at any five locations in a cross-sectional observation of the coating layer 6, and taking the average value thereof.

Here, any one of the following is beneficially used as the base 2: a hard metal that is a cermet or a cemented carbide composed of a hard phase having one of a tungsten carbide and a titanium carbonitride as a main component and a binding phase having an iron group metal such as cobalt, nickel, and the like as a main component; a ceramic having one of a silicon nitride and an aluminum oxide as a main component; and a hard material such as an ultra-high pressure sintered body composed of a hard phase made up of one of a multicrystalline diamond and a cubic boron nitride and a binding phase composed of a ceramic, an iron group metal, or the like, and sintered under ultra-high pressure.

In addition, according to the present embodiment and as illustrated in FIGS. 2A and 2B, in the cutting tool 1, the average aspect ratio of the columnar crystals 7 on the flank face 4 is greater than the average aspect ratio of the columnar crystals 7 on the rake face 3. As a result, on the flank face 4, the orientation of the columnar crystals 7 is inclined diagonally with respect to the thickness direction of the coating layer 6, which is the direction orthogonal to the surface of the base 2, and the average aspect ratio of the columnar crystals 7 is large. As such, any cracks formed in the coating layer 6 are unlikely to develop in the thickness direction of the coating layer 6. This enables the development of such cracks to be constrained. As a result, the chipping resistance of the coating layer 6 is improved on the flank face 4, and boundary damage, to which the flank face 4 is prone, may also be constrained. In addition, the average aspect ratio of the columnar crystals 7 is smaller on the rake face 3 than on the flank face 4. As such, oxidation of the coating layer 6 may be constrained from progressing more deeply through the grain boundaries of the crystals making up the coating layer 6. As a result, the oxidation resistance of the coating layer 6 is improved on the rake face 3, and crater wear, which develops easily on the rake face 3, may be constrained.

Furthermore, in the present embodiment, the average aspect ratio of the columnar crystals 7 on the nose portion 9 is greater than the average aspect ratio of the columnar crystals 7 on the flank face 4. As a result, the chipping resistance of the nose portion 9 may be improved further.

In the present invention, the aspect ratio of the columnar crystals 7 refers to the ratio of the longitudinal direction of the crystal, which is the direction in which each of the columnar crystals 7 is longest as described above, to the length of the crystal in the width direction of a longest length among directions orthogonal to the longitudinal direction (length in the longitudinal direction/length in the width direction). The average aspect ratio refers to an average value of the aspect ratios of any 10 of the columnar crystals 7 as observed in an area having a width of 10 μm×the thickness of the coating layer 6.

Here, in a situation where the coating layer 6 includes a plurality of stacked layers and crystal growth has continued between these layers, the whole growth is regarded as a single columnar crystal and the above-described method is used to calculate the average aspect ratio. In addition, in a situation where the coating layer 6 includes a plurality of stacked layers and is made up of different crystals at the top and bottom layers without continuous crystal growth between the layers, the shape and inclination status of the crystals making up each layer are individually checked, and an average value taking into account the proportional thickness of each layer is used for the overall shape and inclination status of the crystals in the coating layer 6. The average value taking into account the proportional thickness of each layer is, for example, calculated such that the inclination angle of the coating layer 6 in which the coating layer includes a stack of a first layer having a first thickness and a second layer having a second thickness is (inclination angle of crystals making up the first layer×first thickness+inclination angle of crystals making up the second layer×second thickness)/(first thickness+second thickness).

Here, in the present embodiment, the average aspect ratio of the columnar crystals 7 on the flank face 4 is from 3 to 15, and the average aspect ratio of the columnar crystals 7 on the rake face 3 is from 1.5 to 5. Within this range, the effect of constraining the development of crater wear in the rake face 3 is high, and the effect of constraining the chipping of the flank face 4 is also high.

In addition, in the present embodiment, the ratio of an average crystal width of the columnar crystals 7 on the flank face 4 to the average crystal width of the columnar crystals 7 on the rake face 3 is from 0.8 to 1.2. That is, the columnar crystals have a crystal width that is equal on both the flank face 4 and the rake face 3. As such, the wear resistance and the fracture resistance of the flank face 4 and the rake face 3 are high. Here, the average crystal width of the columnar crystals 7 of the present invention refers to the average width in a direction parallel to the surface of the base 2 of the columnar crystals 7. The specific measurement method is to draw a straight line parallel to the direction of the surface of the base 2 at a median position in the thickness direction of the coating layer 6, measure the number of grain boundaries traversing the straight line, and divide the length of the straight line by the number of grain boundaries measured. Here, in a situation where the coating layer 6 includes a plurality of stacked layers and is made up of different crystals at the top and bottom layers without continuous crystal growth between the layers, the average crystal width is respectively measured at a median position of each layer thickness. The average crystal width of the coating layer 6 is then an average value taking the proportional thickness of each layer into consideration. In a situation where the plurality of layers is stacked with continuous crystal growth between the layers, such that the same crystals form the top and bottom layers, then the whole is counted as a single columnar crystal extending across the layers.

Furthermore, in the present embodiment, from 2 to 5 of the columnar crystals 7 are found, on average, in the longitudinal direction of the columnar crystals 7 in the coating layer 6 on the flank face 4. Similarly, from 3 to 10 of the columnar crystals 7 are found, on average, in the longitudinal direction of the columnar crystals 7 in the coating layer 6 on the rake face 3. As a result, grain boundaries are found in large quantities in the thickness direction of the coating layer 6 on the rake face 3, and the oxidation resistance of the rake face 3 is high. As such, the progression of crater wear in the rake face 3 may be constrained. In addition, upon impact onto the flank face 4, the impact is propagated along the grain boundaries from the thickness direction of the coating layer 6 in the direction of inclination. As such, the impact is easily absorbed and chipping may be constrained from occurring. Here, in the present invention, the average number of the columnar crystals 7 in the longitudinal direction is calculated by drawing a straight line in the thickness direction of the coating layer 6, measuring the number of crystals traversing the straight line, and taking the average value over any five locations.

Manufacturing Method

A manufacturing method of the cutting tool of the present invention is described next. First, the base is manufactured in the shape of the tool using a conventional known method. Next, the coating layer is formed on the surface of the base. Physical vapor deposition (PVD) using an ion plating method, a sputtering method, or the like is beneficially applicable as the method of formation for the coating layer. An example of the details of the formation method is described with reference to FIG. 3, which is a schematic diagram of an arc ion plating film deposition device (hereinafter abbreviated AIP device) 20, and to FIG. 4, which is a schematic diagram illustrating a rotating state of a specimen during formation.

Figure 3:
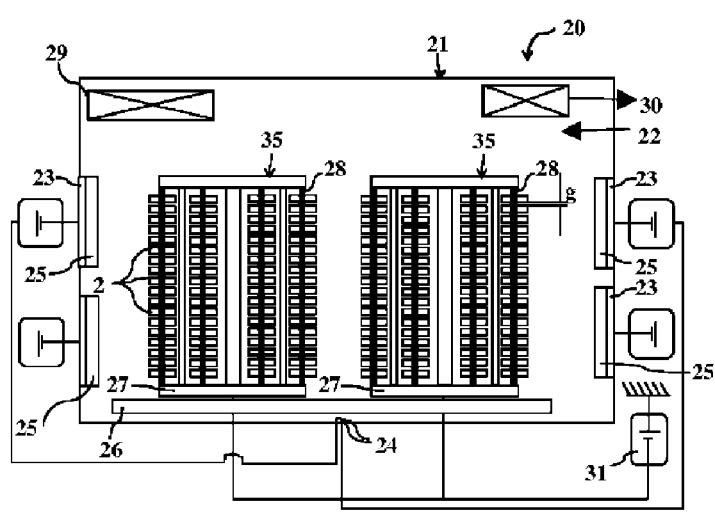
FIG. 3 is a schematic view of a film deposition device used in film deposition process of a coating layer of the cutting tool of FIGS. 1, 2A, and 2B.
Figure 4:
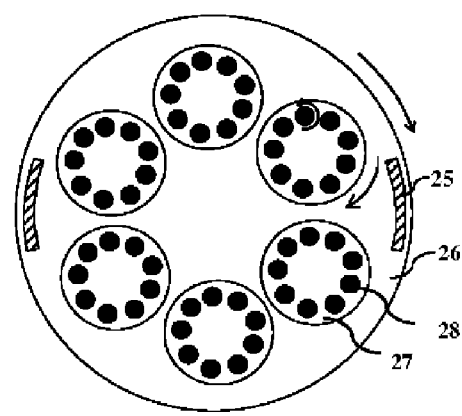
FIG. 4 is a schematic view illustrating a rotating state of a specimen on the film deposition device of FIG. 3.

The AIP device 20 of FIG. 3 is configured to take in a gas such as $N_2$, Ar, or the like into a vacuum chamber 21 through a gas intake port 22, have a cathode electrode 23 and an anode electrode 24 disposed therein, generate a plasma by applying a high voltage between the two electrodes, vaporize and ionize a desired metal or ceramic from a target 25 into a high-energy state using the plasma, and apply the ionized metal to the surface of a specimen (the base 2) so that the coating layer 6 covers the surface of the base 2 as illustrated in FIGS. 2A and 2B. In addition, as per FIGS. 3 and 4, a rotating table 26 is mounted inside the vacuum chamber 21. A sub-turntable 27 and a plurality of shaft rods 28 mounted thereon are provided on the rotating table 26. Also, a plurality of towers 35 is skewered onto the shaft rods 28, each of the towers 35 being made up of the base 2 in plurality (illustrated as two sets in FIG. 3 and as six sets in FIG. 4). Furthermore, as per FIG. 3, a heater 29 for heating the bases 2, a gas exhaust port 30 for expelling the gas outside the system, and a bias power supply 31 for applying a bias voltage to the bases 2 are provided.

Here, according to the present embodiment, the setting of the bases 2 into the film deposition chamber is performed so that the flank face (side face) of each of the bases 2 is parallel with respect to the surface of the target 25, as illustrated in FIG. 3. Then, the metal source is vaporized and ionized by arc discharge, glow discharge, or the like using the target 25, simultaneously causing a reaction with the nitrogen ($N_2$) gas serving as the nitrogen source, the methane ($CH_4$)/acetylene ($C_2H_2$) gas serving as a carbon source, and the like. This results in the coating layer 6 being deposited on the surface of the base 2.

Here, each of the rotating table 26, the sub-turntable 27, and the shaft rods 28 individually rotate. However, in the present example of the embodiment, the rotation is in the direction indicated in FIG. 4. That is, the rotating table 26 and the sub-turntable 27 rotate in the same direction (clockwise in FIG. 4). Then, the shaft rods 28 rotate in a direction opposite the direction of rotation of the rotating table 26 and the sub-turntable 27 (counterclockwise in FIG. 4). The rotating table 26 rotates at a rate of from 1 rpm to 4 rpm, and the sub-turntable 27 rotates at not less than three times the rate of rotation of the rotating table 26, specifically rotating at from 5 times to 10 times the rate of rotation of the rotating table 26. In addition, the shaft rods 28 each rotate at a rate of from 1 rpm to 5 rpm, and specifically rotate at a rate of from 1.5 rpm to 3 rpm. As a result, the inclination angle of the columnar crystals on the rake face and the inclination angle of the columnar crystals on the flank face may be constrained within a predetermined range. Here, as per FIG. 4, the rotating table 26 and the sub-turntable 27 rotate in the same direction (clockwise in FIG. 4). However, no such limitation of the present invention is intended. The rotating table 26 and the sub-turntable 27 may also rotate in opposite directions. In such a situation, for example, the sub-turntable 27 rotates at a rate that is not less than 5 times the rate of rotation of the rotating table 26, and is specifically from 7 to 12 times the rate of rotation of the rotating table 26. As such, the inclination angle of the columnar crystals may be adjusted within the predetermined range.

According to the present embodiment, the bases 2 are set in the above-described direction. As such, the flank face 4 is at a position where the metal component from the target 25 linearly arrives. Thus, the speed of formation may easily be increased as the metal component from the target 25 has a linear flight path. Conversely, the rake face 3 is oriented opposite the target 25, such that the metal component from the target 25 must travel around before arriving. This is likely to decrease the speed of formation.

Here, a gap g between neighboring top and bottom specimens is from 0.5 to 1 times the thickness of the specimens. As a result, this enables a configuration in which the average orientation of the longitudinal direction of the columnar crystals 7 on the flank face 4 is inclined with respect to the direction orthogonal to the surface of the base 2 (the inclination angle θ2>0 in FIGS. 2A and 2B). Also, in this configuration, the average aspect ratio of the columnar crystals 7 on the flank face 4 is greater than the average aspect ratio of the columnar crystals 7 on the rake face 3. That is, given that the gap g between the neighboring top and bottom specimens is narrow, being from 0.5 to 1 times the thickness of the specimens, the formation state for the coating layer varies between the main surfaces, serving as the rake face and the seating surface, and the side surface, serving as the flank face. This enables the growth status of the crystal to be formed to be varied. Furthermore, given that the gap g between the neighboring top and bottom specimens is narrow, being from 0.5 to 1 times the thickness of the specimens, the average inclination angle of the longitudinal direction of the columnar crystals 7 on the nose portion 9 may be made larger.

In addition, the target 25 may be, for example, a metal target independently including each of metal titanium (Ti), metal aluminum (Al), and a metal M (where M is one or more elements selected from among elements other than Ti in group 4, group 5, and group 6 of the periodic table, the rare earth metals, and Si), may be an alloy target in which these metals are alloyed, and may also be a mixture target formed from one of a compound powder and a sintered body of these metals. The target 25 is set onto a side wall surface position of the chamber.

The formation conditions are such that the metal source is vaporized and ionized by arc discharge, glow discharge, or the like using such a target, simultaneously causing a reaction with the nitrogen ($N_2$) gas serving as the nitrogen source and the methane ($CH_4$)/acetylene ($C_2H_2$) gas serving as the carbon source, and the coating layer is formed by an ion plating method or a sputtering method. Here, while forming the above-described coating layer, in the present embodiment, a bias voltage of from 35 V to 200 V, and specifically from 75 V to 150 V, is applied in order to create a high hardness coating layer and to increase the adhesion with the base in consideration of the crystal structure of the coating layer.

EXAMPLES

A tungsten carbide (WC) powder having an average grain diameter of 0.9 μm was used as a main component, combined into a compound with additives in respective proportions of 10 mass % of metal cobalt (Co) powder having an average grain diameter of 1.2 μm and 0.5 mass % of chromium carbide ($Cr_3C_2$) powder having an average grain diameter of 1.0 μm. The compound was formed into a throw-away tip shape using a Kyocera cutting tool BDMT11T308ER-JT by press molding. Afterward, debinding processing was applied, and a cemented carbide was manufactured by sintering for one hour at 1450° C. in a vacuum of 0.01 Pa. In addition, the surface rake face of each specimen was subjected to polishing processing by blasting processing, brushing processing, and the like. Furthermore, tip treatment (honing) was applied as part of the brushing processing of the manufactured cemented carbide.

A bias voltage was applied to the base manufactured in this manner in accordance with Table 1, and arc currents of 150 A each were emitted. The specimens were rotated with the gap g between the respective rake face and seating surface of the specimens being set as indicated in Table 1 (Table 1 lists the proportion with respect to the thickness of the specimens) and using the respective rates of rotation indicated in Table 1 for the rotating table, the sub-turntable, and the shaft rods. The coating layer was thus formed with the composition indicated in Table 2 at a formation temperature of 540° C. Here, the overall composition of the coating layer was measured using an energy dispersive spectroscopic analysis method (EPMA) by performing observation of a cross-section that includes the coating layer of each specimen with a scanning electron microscope (SEM). In addition, the detailed configuration of each coating layer was checked using an energy dispersive X-ray analysis method (EDS) through observation of the coating layers with a transmission electron microscope (TEM).

TABLE 1

| Specimen No. | Gap g | Rate of rotation (rpm) | | | Bias voltage (V) |
| | | Rotating table | Sub-turntable | Shaft rod | |
| --- | --- | --- | --- | --- | --- |
| 1 | 0.5 | 2 | 12 | 2 | 75 |
| 2 | 0.6 | 4 | 20 | 2 | 75 |
| 3 | 0.7 | 3 | 18 | 3 | 150 |
| 4 | 0.9 | 3 | 12 | 2 | 75 |
| 5 | 0.8 | 4 | 24 | 1.5 | 100 |
| 6 | 0.9 | 1 | 10 | 1.5 | 75 |
| 7 | 1 | 2 | 16 | 2 | 150 |
| 8 | 0.8 | 0.5 | 4 | 3 | 75 |
| 9 | 0.6 | 2 | 30 | 1 | 100 |
| 10 | 2 | 2 | 12 | 2 | 75 |
| 11 | 0.4 | 2 | 15 | 2 | 100 |

TABLE 2

| Specimen No. | Overall coating layer composition | Detailed coating layer configuration | | |
| | | Configuration | Layer A | Layer B |
| --- | --- | --- | --- | --- |
| 1 | $Al_{0.50}Ti_{0.50}N$ | Single-layer | — | |
| 2 | $Al_{0.48}Ti_{0.48}Si_{0.04}N$ | Stack (Top layer: Layer A- Bottom layer: Layer B) | $Al_{0.45}Ti_{0.45}Si_{0.10}N$ | $Al_{0.50}Ti_{0.50}N$ |
| 3 | $Al_{0.57}Ti_{0.25}Cr_{0.15}Si_{0.03}N$ | Repeating stack of layer A/ layer B (60/60) | $Al_{0.52}Ti_{0.44}Si_{0.04}N$ | $Al_{0.65}Cr_{0.35}N$ |
| 4 | $Al_{0.50}Ti_{0.40}Cr_{0.04}Si_{0.04}N$ | Single layer | — | |
| 5 | $Al_{0.52}Ti_{0.27}Cr_{0.16}Nb_{0.03}W_{0.01}Si_{0.01}N$ | Repeating stack of layer A/ layer B (60/60) | $Al_{0.39}Ti_{0.53}Nb_{0.08}W_{0.02}N$ | $Al_{0.05}Cr_{0.33}Si_{0.02}N$ |
| 6 | $Al_{0.35}Ti_{0.43}Cr_{0.17}W_{0.05}C_{0.2}N_{0.6}$ | Single-layer | — | |
| 7 | $Al_{0.30}Ti_{0.60}Y_{0.10}N$ | Single-layer | — | |
| 8 | $Al_{0.50}Ti_{0.25}Cr_{0.20}Si_{0.05}N$ | Single-layer | — | |
| 9 | $Al_{0.50}Ti_{0.45}Si_{0.05}N$ | Single-layer | — | |
| 10 | $Al_{0.50}Ti_{0.25}Cr_{0.20}Si_{0.35}N$ | Single-layer | — | |
| 11 | $Al_{0.50}Ti_{0.45}Si_{0.05}N$ | Single-layer | — | |

In addition, the thickness of the coating layer was measured at five desired locations on each of the rake face, the flank face, and the nose portion using SEM observation, and the average values of the thickness tr, tf, and to thereof were calculated. Furthermore, an electron backscatter diffraction method (EBSD) was used with the SEM observation to specify an outline of each crystal from a color map. The shape and inclination angle of the columnar crystals in the coating layer was thus measured for each of the rake face, the flank face, and the nose portion. In Table 3, the average aspect ratio is listed under aspect ratio, the average crystal width is listed under crystal width, the average number of the columnar crystals in the longitudinal direction is listed under count, the average inclination angles of the respective columnar crystals in each of the rake face, the flank face, and the nose portion are listed as θ1, θ2, and θ3, and the respective thicknesses of the coating layers on each of the rake face, the flank face, and the nose portion are listed under tr, tf, and tn. The results are given in Tables 3 and 4.

TABLE 3

| Specimen No. | Rake face | | | | | Flank face | | | | | |
|---|---|---|---|---|---|---|---|---|---|---|---|
| | Aspect ratio | Crystal width (μm) | Count (number) | θ1 (°) | tr (μm) | Aspect ratio | Crystal width (μm) | Count (number) | θ2 (°) | tf (μm) | tf/tr |
| 1 | 2 | 0.45 | 8.8 | 4 | 2.2 | 4 | 0.5 | 3.2 | 20 | 4.8 | 2.18 |
| 2 | 3 | 0.35 | 5.2 | 15 | 3.4 | 10 | 0.45 | 4.0 | 45 | 5.0 | 1.47 |
| 3 | 4 | 0.3 | 7.0 | 8 | 3.3 | 8 | 0.35 | 3.4 | 30 | 4.1 | 1.24 |
| 4 | 4 | 0.6 | 6.2 | 6 | 2.6 | 7 | 0.5 | 3.0 | 24 | 3.6 | 1.38 |
| 5 | 3 | 0.5 | 6.4 | 12 | 3.4 | 6 | 0.4 | 2.8 | 40 | 5.1 | 1.50 |
| 6 | 4 | 0.35 | 4.0 | 0 | 2.3 | 5 | 0.45 | 3.4 | 12 | 3.4 | 1.48 |
| 7 | 1.5 | 0.6 | 4.8 | 3 | 2.5 | 3 | 0.5 | 4.2 | 18 | 4.3 | 1.72 |
| 8 | 4 | 0.4 | 3.0 | 1 | 1.8 | 3 | 0.6 | 2.0 | 1 | 3.2 | 1.78 |
| 9 | 2 | 0.4 | 6.2 | 35 | 2.5 | 2 | 0.5 | 2.8 | 25 | 3.5 | 1.40 |
| 10 | 4 | 0.4 | 3.4 | 1 | 3.8 | 4 | 0.4 | 3.2 | 1 | 4.0 | 1.05 |
| 11 | 1 | 0.2 | 11.8 | 16 | 1.0 | 4 | 0.5 | 3.0 | 10 | 3.1 | 3.10 |

Next, cutting testing was performed under the following cutting conditions using the resulting throw-away tip. The results are given in Table 4.
Cutting method: Milling processing
Cutting material: Mold steel (SKD11)
Cutting speed: 120 m/min
Feed: 0.12 mm/rev
Depth of cut: 2.0 mm×12.5 mm
Cutting conditions: Dry
Evaluation method: Cutting tool observed after 20 minutes of processing, Cutting edge status checked. Checked abnormal wear status such as chipping and dents. Also checked processing time to end of tool useful life.

TABLE 4

| Specimen No. | Nose portion | | | | | | Cutting ability | |
|---|---|---|---|---|---|---|---|---|
| | Aspect ratio | Crystal width (μm) | Count (number) | θ3 (°) | tn (μm) | tn/tf | Cutting edge status | Processing time (minutes) |
| 1 | 6 | 0.45 | 2.4 | 30 | 6.0 | 1.25 | Good | 38 |
| 2 | 12 | 0.3 | 3.0 | 50 | 6.5 | 1.30 | Good | 40 |
| 3 | 9 | 0.3 | 2.2 | 40 | 5.5 | 1.34 | Good | 42 |
| 4 | 10 | 0.35 | 2.2 | 35 | 5.0 | 1.39 | Good | 39 |
| 5 | 8 | 0.35 | 2.0 | 50 | 6.8 | 1.33 | Good | 45 |
| 6 | 6 | 0.4 | 2.4 | 15 | 5.5 | 1.62 | Minute chipping | 35 |
| 7 | 4 | 0.45 | 3.4 | 20 | 5.3 | 1.23 | Minute chipping | 37 |
| 8 | 5 | 0.5 | 2.0 | 5 | 5.0 | 1.56 | Interface defects | 20 |
| 9 | 1 | 0.6 | 3.0 | 25 | 4.0 | 1.14 | Large nose wear | 25 |
| 10 | 3 | 0.35 | 3.2 | 5 | 5.0 | 1.25 | Large crater wear | 20 |
| 11 | 3 | 0.35 | 2.8 | 15 | 4.5 | 1.45 | Large crater wear | 25 |

As indicated by the results in Tables 1 to 4, specimens No. 8 to 11, in which the relationship between the respective inclination angles θ1 and θ2 of the columnar crystals in the coating layer of the rake face and the flank face were outside the range of the present invention, were prone to chipping on the Cutting edge, and had a shorter useful life due to the progression of crater wear on the rake face. In addition, for specimen No. 8, in which the average aspect ratio of the columnar crystals on the rake face was greater than the average aspect ratio of the columnar crystals in the coating layer on the flank face, the flank face was prone to chipping, and boundary defects occurred. For specimen No. 9, in which the average aspect ratio of the columnar crystals on the rake face and the average aspect ratio of the columnar crystals on the coating layer on the flank face are equal, nose wear progressed on the nose portion of the flank face. Similarly, for specimen No. 10, crater wear progressed on the rake face. Both specimens had a shorter useful life. For specimen 11, in which granular crystals having an average aspect ratio of less than 1.5 were used instead of the columnar crystals as the crystals on the rake face, crater wear progressed on the rake face and the useful life was shorter.

In contrast, specimens No. 1 to 7, which are each within the range of the present invention, all had less occurrence of chipping on the Cutting edge, and crater wear was slower to progress on the rake face. This produced good cutting ability.

REFERENCE NUMBER

1 Cutting tool
2 Base
3 Rake face
4 Flank face
5 Cutting edge
5a Nose cutting edge
5b Straight cutting edge
6 Coating layer
7 Columnar crystal
8 Seating surface
9 Nose portion

What is claimed is:

1. A cutting tool with a rake face, a flank face, and a cutting edge that is an intersection ridge line of the rake face and the flank face, comprising:
   a base; and
   a coating layer formed from a columnar crystal covering a surface of the base,
   wherein an average of an inclination angle (θ2) of a longitudinal direction of the columnar crystal in the flank face with respect to a direction orthogonal to the surface of the base is greater than an average of an inclination angle (θ1) of a longitudinal direction of the columnar crystal in the rake face with respect to the direction orthogonal to the surface of the base.

2. The cutting tool according to claim 1, wherein the inclination angle (θ2) of the columnar crystal in the flank face is from 10° to 50°, and the inclination angle (θ1) of the columnar crystal in the rake face is from 0° to 20°.

3. The cutting tool according to claim 1, wherein an overall composition of the coating layer is formed from $(Al_{1-a-b}Ti_aM_b)\ C_{1-d}N_d$, where M is one or more elements selected from among elements excluding Ti in groups 4, 5, and 6 of the periodic table, Si, and rare earth metals, and where $0.2 \leq a \leq 0.7$, $0 \leq b \leq 0.2$, and $0 \leq d \leq 1$.

4. The cutting tool according to claim 1, wherein a ratio (tf/tr) of a thickness tf of the coating layer in the flank face to a thickness tr of the coating layer in the rake face is from 1.2 to 3.

5. A cutting tool with a rake face, a flank face, and a cutting edge that is an intersection ridge line of the rake face and the flank face, comprising:
   a base; and
   a coating layer formed from a columnar crystal covering a surface of the base,
   wherein an average orientation of a longitudinal direction of the columnar crystal in the flank face is inclined with respect to a direction orthogonal to the surface of the base, and an average aspect ratio of the columnar crystal in the flank face is greater than an average aspect ratio of the columnar crystal in the rake face.

6. The cutting tool according to claim 5, wherein the average aspect ratio of the columnar crystal in the flank face is from 3 to 15, and the average aspect ratio of the columnar crystal in the rake face is from 1.5 to 5.

7. The cutting tool according to claim 5, wherein a ratio of an average crystal width of the columnar crystal in the flank face to an average crystal width of the columnar crystal in the rake face is from 0.8 to 1.2.

8. The cutting tool according to claim 5, wherein
   an average number of crystals of the columnar crystal included in the coating layer in the flank face in the longitudinal direction of the columnar crystal is 2 to 5, and
   an average number of crystals of the columnar crystal included in the coating layer in the rake face in the longitudinal direction of the columnar crystal is 3 to 10.

9. The cutting tool according to claim 1, wherein
   the cutting edge comprises a nose cutting edge having a curve shape and a straight cutting edge having a linear shape,
   a nose portion is provided in the flank face directly below the nose cutting edge, and
   an average of an inclination angle (θ3) of the longitudinal direction of the columnar crystal in the nose portion is greater than the average of the inclination angle (θ2) of the longitudinal direction of the columnar crystal in the flank face.

* * * * *